(12) United States Patent
Masuko et al.

(10) Patent No.: US 7,577,931 B2
(45) Date of Patent: Aug. 18, 2009

(54) SEMICONDUCTOR DEVICE AND METHOD OF MANUFACTURING THE SAME

(75) Inventors: Hiroyuki Masuko, Chiba (JP); Yutaka Sato, Chiba (JP)

(73) Assignee: Seiko Instruments Inc. (JP)

( * ) Notice: Subject to any disclaimer, the term of this patent is extended or adjusted under 35 U.S.C. 154(b) by 381 days.

(21) Appl. No.: 11/350,507

(22) Filed: Feb. 9, 2006

(65) Prior Publication Data

US 2006/0180918 A1    Aug. 17, 2006

(30) Foreign Application Priority Data

Feb. 14, 2005    (JP)    ............... 2005-035880

(51) Int. Cl.
   *G06F 17/50*    (2006.01)
(52) U.S. Cl. ............................. 716/8; 716/15
(58) Field of Classification Search ............... 716/8–12
   See application file for complete search history.

(56) References Cited

U.S. PATENT DOCUMENTS 6,161,215 A * 12/2000 Hollenbeck et al. ........... 716/15
6,339,234 B1 * 1/2002 Takizawa .................... 257/203
6,720,636 B2 * 4/2004 Shimizu et al. ............. 257/459
7,199,472 B2 * 4/2007 Minami et al. .............. 257/758

* cited by examiner

*Primary Examiner*—Jack Chiang
*Assistant Examiner*—Binh C Tat
(74) *Attorney, Agent, or Firm*—Adams & Wilks

(57) ABSTRACT

A semiconductor device has power supply pads including a first power supply pad and at least one second power supply pad that are connected to internal power supply wirings through an internal circuit so that the first and second power supply pads are set to the same potential. The first power supply pad is bonded by a wire to a lead to which a supply voltage is applied and is connected to the round power supply wiring through a round power supply connection wiring. A signal pad from which electrostatic noise enters into the semiconductor device is provided. An input protection circuit is connected between the signal pad and the internal circuit and is connected to the round power supply wiring through a protection circuit power supply wiring. The second power supply pad is not bonded by a wire to a lead to which a supply voltage is applied and is not connected to the round power supply wiring so that when electrostatic noise enters the signal pad, the electrostatic noise is discharged to the exterior of the semiconductor device without the electrostatic noise being led to the internal circuit.

9 Claims, 6 Drawing Sheets

(a)  (b)

(a)  (b)

SEMICONDUCTOR DEVICE AND METHOD OF MANUFACTURING THE SAME

BACKGROUND OF THE INVENTION

1. Field of the Invention

The present invention relates to a semiconductor device having noise-breakdown preventing means for protecting a semiconductor chip from a high-voltage electric noise (hereinafter referred to as "electrostatic noise") due to static electricity or the like that enters the semiconductor chip from the outside. In particular, the present invention relates to a semiconductor device having noise-breakdown preventing means using a wiring pattern in the semiconductor chip.

2. Description of the Related Art

Semiconductor devices are so useful that they are incorporated into a wide variety of apparatus and equipment and massively employed in markets. The semiconductor devices have many kinds of packages that suit the apparatus to which the semiconductor device is incorporated.

A general method of manufacturing a semiconductor device will be described with reference to a simplified manufacturing flowchart shown in FIG. 7. In the semiconductor device described here, a p-type semiconductor substrate is used, and a substrate potential is a supply voltage VSS of a low potential. It is of course possible to use an n-type semiconductor substrate and set a substrate potential as a high-side supply voltage VDD. However, it will be apparent that the operation and effects of the present invention are the same regardless of the selection of the substrate potential. Therefore, the p-type semiconductor substrate will be described below.

In manufacturing a semiconductor device, semiconductor chips 1A are first formed on a wafer-shaped p-type semiconductor substrate in an array (wafer manufacturing process X), and then packaged according to an application form (assembly process Y). FIG. 8 is a perspective plan view showing a semiconductor device that is assembled in a typical resin package 2A as an example of a package. In order to assemble in the package 2A following steps are needed. Each of semiconductor chips 1A that have been formed on the p-type semiconductor device is first separated (dicing A of FIG. 7). Then, the semiconductor chip 1A shown in FIG. 8 is fixedly bonded onto the chip tab 3A of the metal lead frame 71 shown in FIG. 6A (die bonding B of FIG. 7). Subsequently, bonding pads 10 made of metal which are formed on a surface of the semiconductor chip 1A, supply electric power, and input or output electric signals are connected to wire leads 5 of a lead frame 71 as well as a tab lead 31 and tab suspenders 32 by using bonding wires 6 that are made of metal (wire bonding C of FIG. 7). Then, the overall semiconductor chip 1A is sealed with a mold resin in the shapes of the package 2A (molding D of FIG. 7). Thereafter, the wire leads 5 of the lead frame 71 and the tab lead 31 are cut off from the frame rim of the lead frame 71, and the contours of these leads are shaped (shaping E of FIG. 7). Finally, the semiconductor device is inspected, and good products are shipped to the market (shipping inspection F of FIG. 7). A chip tab 3A of the package A is formed integrally with the tab lead 31 and the tab suspenders 32. The plural bonding pads 10 that are bonded to the chip tab 3A, the tab lead 31, and the tab suspenders 32 by the bonding wires 6 are connected to the supply voltage VSS. The effects of the plural bonding pads 10 will be described later.

FIG. 5 shows a cross section of the semiconductor device that has been manufactured through the above-mentioned manufacturing method. Since the dimension of the semiconductor chip 1A is determined by the function or performance of the semiconductor device, circuit width L3 that is an interval between the respective bonding pads 10 formed on the outer periphery of the semiconductor chip 1A is determined by the semiconductor chip 1A. Wire length L2 is determined to be minimum so that the bonding wire 6 is capable of maintaining a loop configuration that is not contact with the edge of the semiconductor chip 1A. Mold margin L1 is determined to be minimum so as to protect the semiconductor chip 1A from moisture or the like. Accordingly, the minimum value of a mold width LT of the mold resin 2A is determined according to the mold margin L1, the wire length L2, and the circuit width L3. Taking sufficient mold margin L1 it is important, in particular, in the semiconductor device to which high reliability is strongly desired.

In the semiconductor device using MOS transistors, there arises a problem of noise breakdown in which a MOS transistor which constitutes an input interface or an output interface to the internal circuit 4 included in the semiconductor chip 1A is destroyed by electrostatic noise that enters the semiconductor device from outside through the bonding pads 10, causing disability of the semiconductor device. Noise breakdown is a problem in which a thin gate oxide film of the MOS transistor constituting the interface or a PN junction formed around the drain terminal of the transistor is destroyed due to the electrostatic noise to lose the function of the MOS transistor.

In a conventional semiconductor device, in order to improve the problem of noise breakdown, there has been proposed a semiconductor device having improved means for high noise-resistance in which an input protection circuit 23 is disposed between the bonding pad 10 and the MOS transistor which forms the interface (for example, refer to JP 04-105357 A).

In FIG. 3, a circuit related to the input protection circuit 23 of the conventional semiconductor device is exemplified by a signal pad IN1. FIG. 3 is a circuit diagram for high noise resistance improved by conventional art showing a connection of the signal pad IN1, the PMOS transistor 27 and the NMOS transistor 28 which form the interfaces of the internal circuit 4, and the input protection circuit 23. An input signal SIN that is entered to the internal circuit 4 from the signal pad IN1 through the input protection circuit 23 is transmitted to the gate terminals of the PMOS transistor 27 and the NMOS transistor 28 through the input protection circuit 23. A cathode terminal of a protection diode 24 is connected to a node of a first protection resistor 25 and a second protection resistor 26 which are included in the input protection circuit 23. An anode terminal of the protection diode 24 is connected to the supply voltage VSS through the protection circuit power supply wiring 12. The gate withstanding voltages VG of the transistors 27 and 28 are determined by the film thickness TG of gate oxides of these transistors or the like. For example, assuming that the gate oxide film thickness TG is 10 nm, the gate withstanding voltage VG is about 10 V. Further assuming that the supply voltage VDD of a high potential for the semiconductor device is 3 V, and the supply voltage VSS of a low potential is 0 V, since the input signal SIN is generally given between 3 V (supply voltage VDD) and 0 V (supply voltage VSS), which are lower than the gate withstand voltage VG, the transistors are not broken. In the semiconductor device having no input protection circuit 23, when a high voltage noise VN of, for example, 100 V, which is higher than the gate withstanding voltage VG enters the signal pad IN1 due to the electrostatic noises, the transistor is broken. However, in the semiconductor device having the input protection circuit 23 as shown in FIG. 3, even if a high voltage noise VN of, for example, 100 V, which is higher than the gate withstanding voltage VG enters the signal pad IN1, the protection diode 24 included in the input protection circuit 23 prevents the high voltage noise VN, causing no breakdown in the transistors. The high voltage noise VN preventing operation of the protection diode 24 is based on the following action of the protection diode 24. In the case where the high voltage noise VN is higher than the supply voltage VDD (VN=100 V), the protection diode 24 breaks down, and the high voltage noise VN is led to the supply voltage. VSS through the protection circuit power supply wiring 12 and the power supply pad VSS1. In the case where the high voltage noise VN is lower than the supply voltage VSS (VN=−100 V), the protection diode 24 allows forward current to flow, and the high voltage noise VN is led to the supply voltage VSS through the protection circuit power supply wiring 12 and the power supply pad VSS1. Accordingly, the shorter wiring length of the protection circuit power supply wiring 12 which connects the protection diode 24 and the power supply pad VSS1 is effective in an improvement of the high noise resistance. The higher the resistance of the first protection resistor 25 and the second protection resistor 26 which are included in the input protection circuit 23 is, the more improvement of the high noise resistance is effective within such a range that the response speed or the like of the input signal SIN is not lowered. Also, the high noise resistance can be improved by using the input protection circuit 23 having a MOS transistor instead of the protection diode 24.

FIG. 4 is an enlarged schematic diagram showing a pad peripheral portion 20 of the semiconductor chip 1A shown in FIG. 8. The semiconductor chip 1A has around power supply wiring 8 in the vicinity of the bonding pads 10. The round power supply wiring 8 is a low-impedance wiring for power supply having sufficient width in the wiring width so that the electrostatic noise can flow. A power supply pad VSS1, a power supply pad VSS 2, and a power supply pad VSS3 are connected to the round power supply wiring 8 through a round power supply connection wiring 9, respectively. In the conventional semiconductor device, the high voltage noise VN that has entered the semiconductor chip from the signal pad IN1 passes through a power supply wiring pattern of the protection circuit power supply wiring 12, the round power supply wiring 8, the round power supply connection wirings 9, and the power supply pad VSS2, and is then led to the supply voltage VSS outside of the semiconductor chip 1A through the bonding wiring 6. As a result, the internal circuit is protected without breakdown.

On the other hand, in the semiconductor device, electronic elements such as transistors are integrated in a large scale as the miniaturization of the semiconductor device manufacturing technology is advanced. As a result, the power supply wiring through which the electric power is supplied to the electronic elements becomes thinner and longer to increase the power-supply-wiring impedance. This makes it difficult to sufficiently supply a necessary power to the electronic element, and leads to a problem of growing power-supply-wiring impedance in that there occurs a trouble with the function or operation of the semiconductor device. In addition, it is needless to say that an increase in the power-supply-wiring impedance becomes an obstacle which prevents the high voltage noise VN from being led to the supply voltage VSS.

As the conventional semiconductor device, there has been proposed a semiconductor device having plural power supply pads which are connected to the same power supply wiring in order to improve the problem of growing impedance (for example, refer to JP 61-121450 A).

Now, the conventional semiconductor device will be described with reference to FIG. 8.

In the conventional semiconductor device shown in FIG. 8, the semiconductor chip 1A is die-bonded on the chip tab 3A having two tab suspenders 32 in addition to the tab lead 31, and the plural bonding pads 10 that are disposed on the surface of the semiconductor chip 1A are electrically connected to the wire leads 5, the tab lead 31, and the tab suspenders 32 by the bonding wires 6. On the other hand, the power supply pad VSS1, the power supply pad VSS2, and the power supply pad VSS3 which are disposed within the semiconductor chip 15 are connected to the internal circuit 4 through the round power supply wiring 8 and the lead frame 7. The internal circuit 4 is disposed with signal wirings and power supply wirings for the supply voltage VDD and the supply voltage VSS, which are not shown in FIG. 8. The semiconductor chip 1A obtains a signal, the power supply voltage VDD, and the power supply voltage VSS from the bonding pad 10 to achieve the functions. In the internal circuit 4 composed of a large number of sub circuits (not shown), signal wirings through which signals are transmitted to the respective sub circuits and power supply wirings through which the supply voltage is applied to the respective sub circuits are formed in a mesh pattern. In the supply voltage VSS, the power supply pad VSS1 is supplied to the semiconductor chip 1A from the tab lead 31, and the power supply pad VSS2 and the power supply pad VSS3 are supplied to the semiconductor chip 1A from the tab suspenders 32 having the same potential as that of the tab lead 31, respectively. The power supply pads VSS1, VSS2, and VSS3 are connected to each other through the round power supply wiring 8 and the round power supply connection wirings 9, which are disposed in the vicinity of the bonding pads 10. Accordingly, because the pattern for the power supply wiring is formed in a mesh pattern, it is apparent that the power-supply-wiring impedance is remarkably improved.

According to the above-mentioned related art, an appropriate power supply wiring pattern is formed on the semiconductor chip, thereby making it possible to realize a semiconductor device having a high reliability which is capable of supplying an electric power, with a high electrostatic noise resistance through provision of an input protection circuit and with a low impedance through provision of plural power supply pads.

FIGS. 2A and 2B show two types of packages. FIG. 2A is a dimensional plan view showing a package B that is smaller in size than the package A, and. FIG. 2B is a dimensional plan view showing a package A in which the semiconductor chip 1A is assembled according to the related art. The plan dimensions of the package A and the package B are of the same size in the longitudinal dimension, but the lateral dimension of the package B is smaller than that of the package A. FIG. 6A is a plan view showing a lead frame 7A used in the package A of the conventional semiconductor device, and FIG. 6B is a plan view showing a lead frame 7B used in the package B. The lead frame 7B is designed in such a manner that intervals between the respective wire leads 5 are narrowed, and the tab suspenders 32 are cut off to reduce the lateral dimension of the lead frame 7A so that the lead frame 7B is capable of being used for a downsized package B according to the market's demand.

Considering the noise resistance in the case where the semiconductor chip is assembled in those packages, there can be realized the semiconductor device that is high in the reliability as described above so far as the semiconductor chip 1A having the plural power supply pads which are connected to the round power supply wiring 8 through the round power supply connection wirings 9 is assembled in the package A.

Therefore, when the semiconductor chip 1A is assembled in the package-B having no tab suspenders 32, the power supply pad VSS2 and the power supply pad VSS3 are not bonded by wire, and non-connected power supply pads occur. When the non-connected power supply pads thus occur, the high voltage noise VN that has been avoided in the input protection circuit 23 is not led from the power supply pad VSS2 to the external power supply. For example, the high voltage noise VN that has entered the signal pad IN1 passes the internal circuit 4 via the round power supply wiring 8 and the internal power supply wiring 11, and leads the high voltage noise VN to the external power supply through the power supply pad VSS1 and the power supply pad VDD3. With the above structure, the MOS transistor in contact with the power supply wiring of the internal circuit 4 is broken down. Accordingly, when the non-connected power supply pad which is not bonded by wire exists within the semiconductor chip 1A, there arises a problem in that the high noise resistance of the semiconductor device reversely deteriorates. When the semiconductor chip including the pad layout is changed in design, a problem in that the above-mentioned high noise resistance deteriorates can be prevented, but a delay of productization due to the design change or an increase in the costs related to the semiconductor manufacture is not prevented. In addition, the design change is liable to induce an unexpected error.

SUMMARY OF THE INVENTION

The present invention has been made to solve the above-mentioned problems, and therefore an object of the present invention is to apply an existing semiconductor chip to a new package at a low cost and in a short period of time.

In order to achieve the above object, there are provided a semiconductor device in which a part of a power supply wiring pattern of the semiconductor chip is cut off, and a method of manufacturing the semiconductor device.

There is provided a semiconductor device, including: a round power supply wiring; a plurality of power supply pads that are connected to the same potential through internal power supply wirings; a signal pad; and an input protection circuit that is connected between the signal pad and an internal circuit and connected to the round power supply wiring through a protection circuit power supply wiring, in which a first power supply pad that is bonded by wire is connected to the round power supply wiring through a first round power supply connection wiring, and a second round power supply connection wiring of a second power supply pad that is not bonded by wire has a cut-off semiconductor chip.

There is provided a method of manufacturing a semiconductor device, including the steps of: producing a pad formation mask resulting from cutting off a round power supply connection wiring that is connected to a power supply pad that is not bonded by wire by using first wire cutting means; and separating the power supply pad that is not bonded by wire from a round power supply wiring by using the pad formation mask.

There is provided a method of manufacturing a semiconductor device having a plurality of power supply pads connected to a round power supply wiring through round power supply connection wirings, the method including the step of cutting one or a plurality of the round power supply connection wirings by using second wire cutting means to separate a power supply pad that is not bonded by wire among the plurality of power supply pads from the round power supply wiring.

According to the present invention, in the semiconductor device having one or plural round power supply connection wirings cut off according to a slight change which can be implemented in a short period without causing an error, the power supply pad that is not bonded by wire is separated from the round power supply wiring, so the high voltage noise VN that is evacuated by the input protection circuit is externally discharged through the power supply pad which is bonded by wire through the round power supply wiring, not through the internal circuit, thereby making it possible to be adapted to various packing modes without deteriorating the high noise resistance. In addition, since the semiconductor chip having the cut-off round power supply connection wiring can be used without substantially changing a manufacturing device, a jig, and a test program for the semiconductor chip in which the round power supply connection wiring is not cut off, the cost merits of the semiconductor device according to the present invention are great.

DETAILED DESCRIPTION OF THE PREFERRED EMBOBIDIMENTS

Now, a description will be given in more detail of preferred embodiments of the present invention with reference to the accompanying drawings.

The present invention aims to provide a semiconductor device that is assembled in a package which the market demands cost-effectively, timely and without deteriorating reliability, and to provide a method of manufacturing the semiconductor device.

Figure 1:
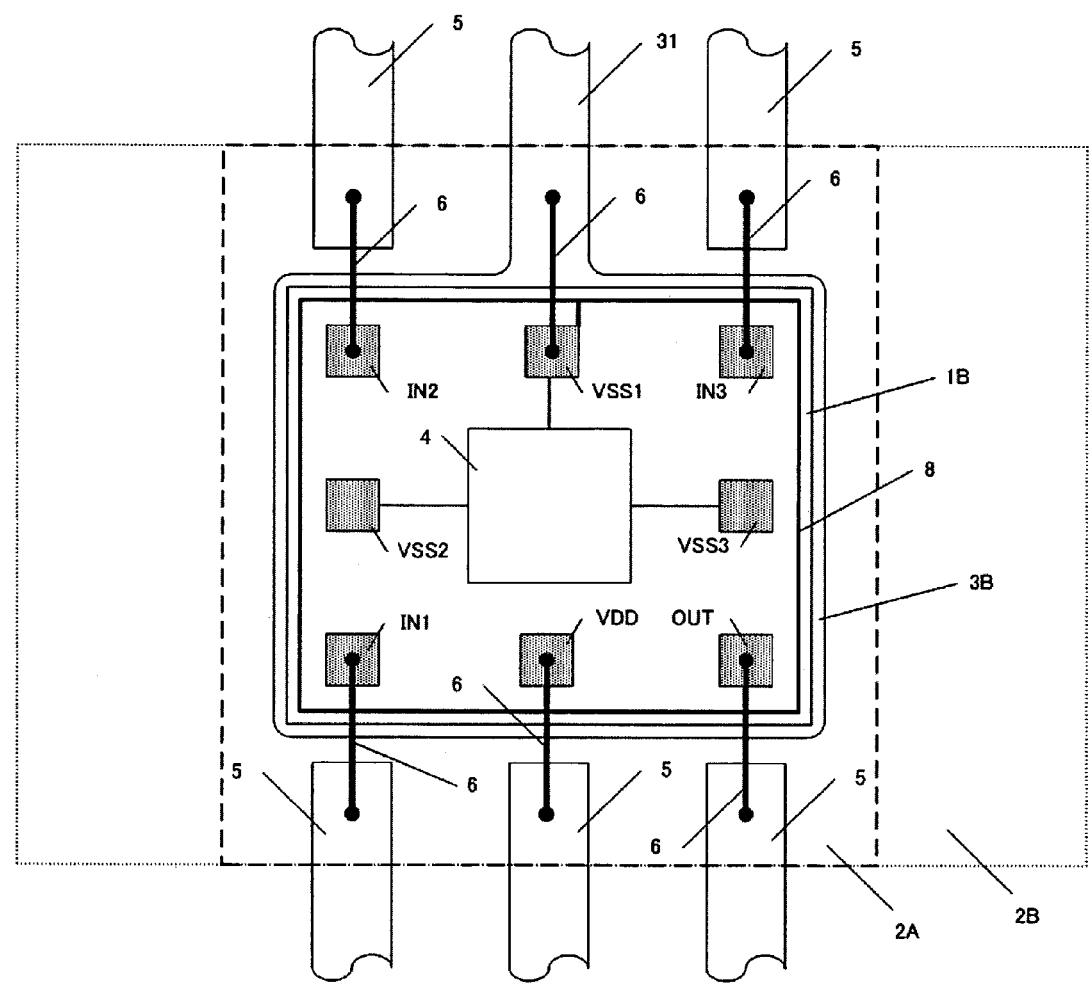
FIG. 1 is a perspective plan view of a semiconductor device according to an embodiment of the present invention.
Figure 2:
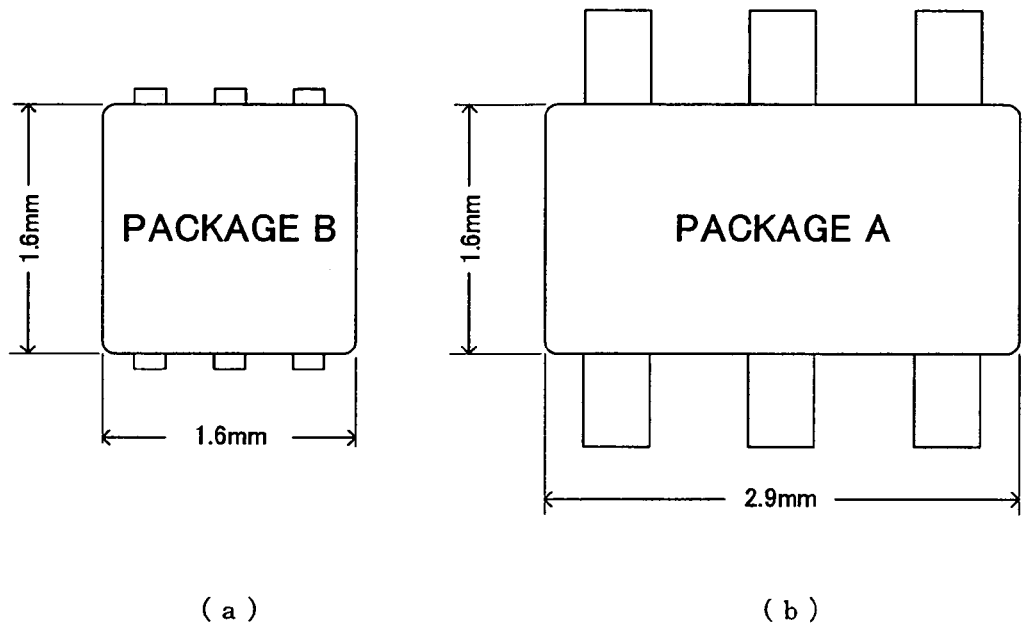
FIGS. 2A and 2B each are dimensional plan view of a general package of a semiconductor device.
Figure 3:
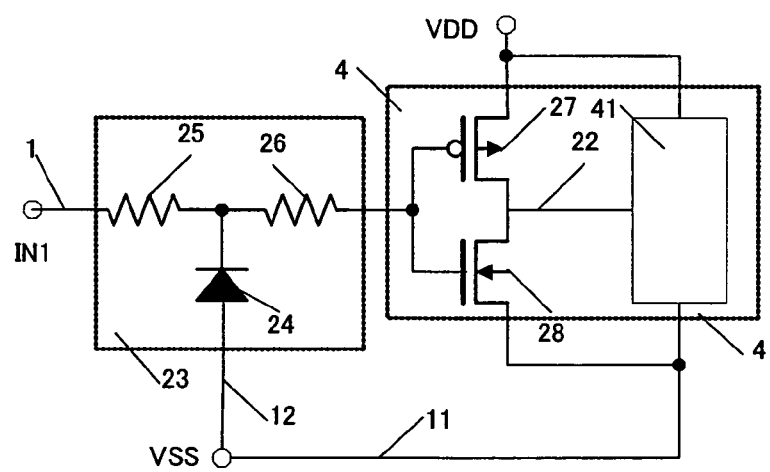
FIG. 3 is a diagram showing an input protection circuit of a conventional semiconductor device.
Figure 4:
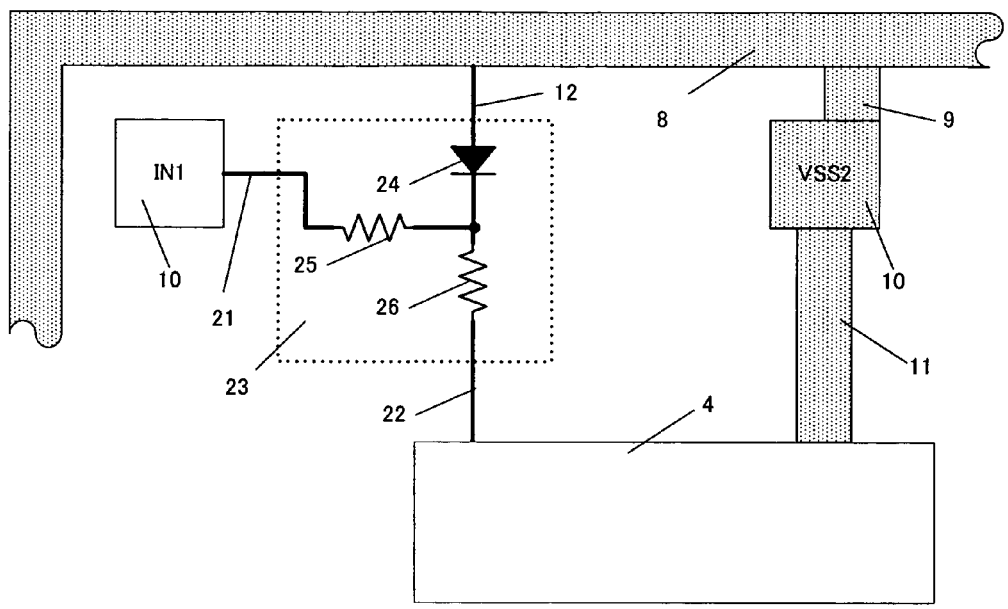
FIG. 4 is an enlarged schematic diagram showing a signal pad periphery in the conventional semiconductor device.
Figure 5:
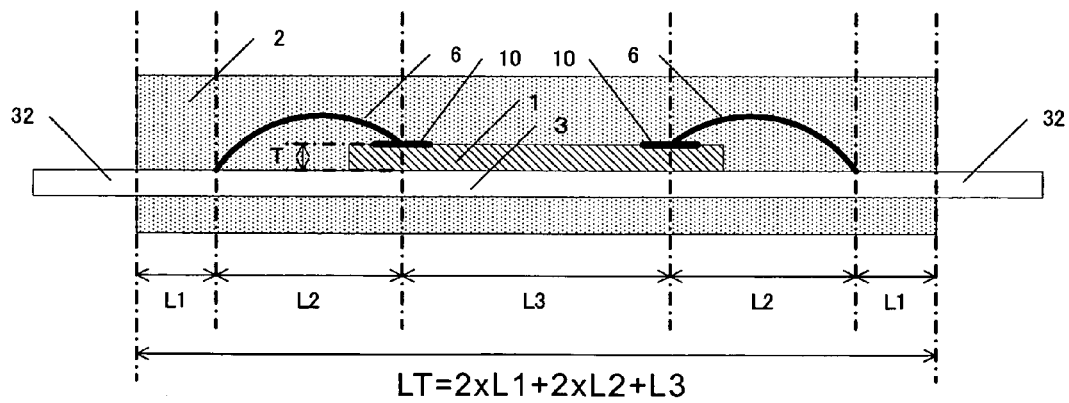
FIG. 5 is a plan view of a conventional lead frame.
Figure 6:
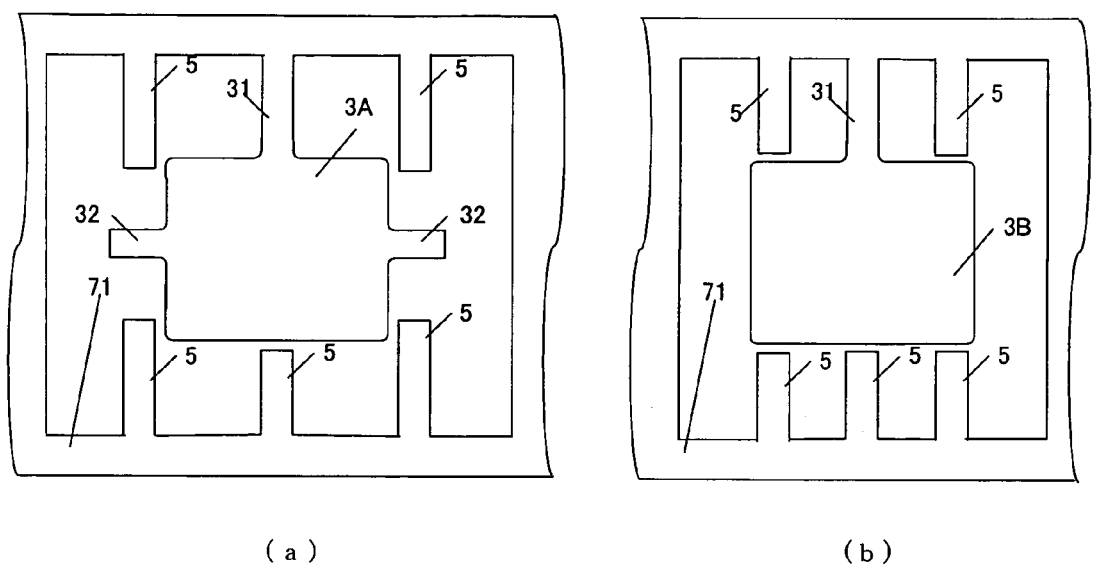
FIGS. 6A and 6B each are plan view of a lead frame used in the package shown in FIG. 2, respectively.
Figure 7:
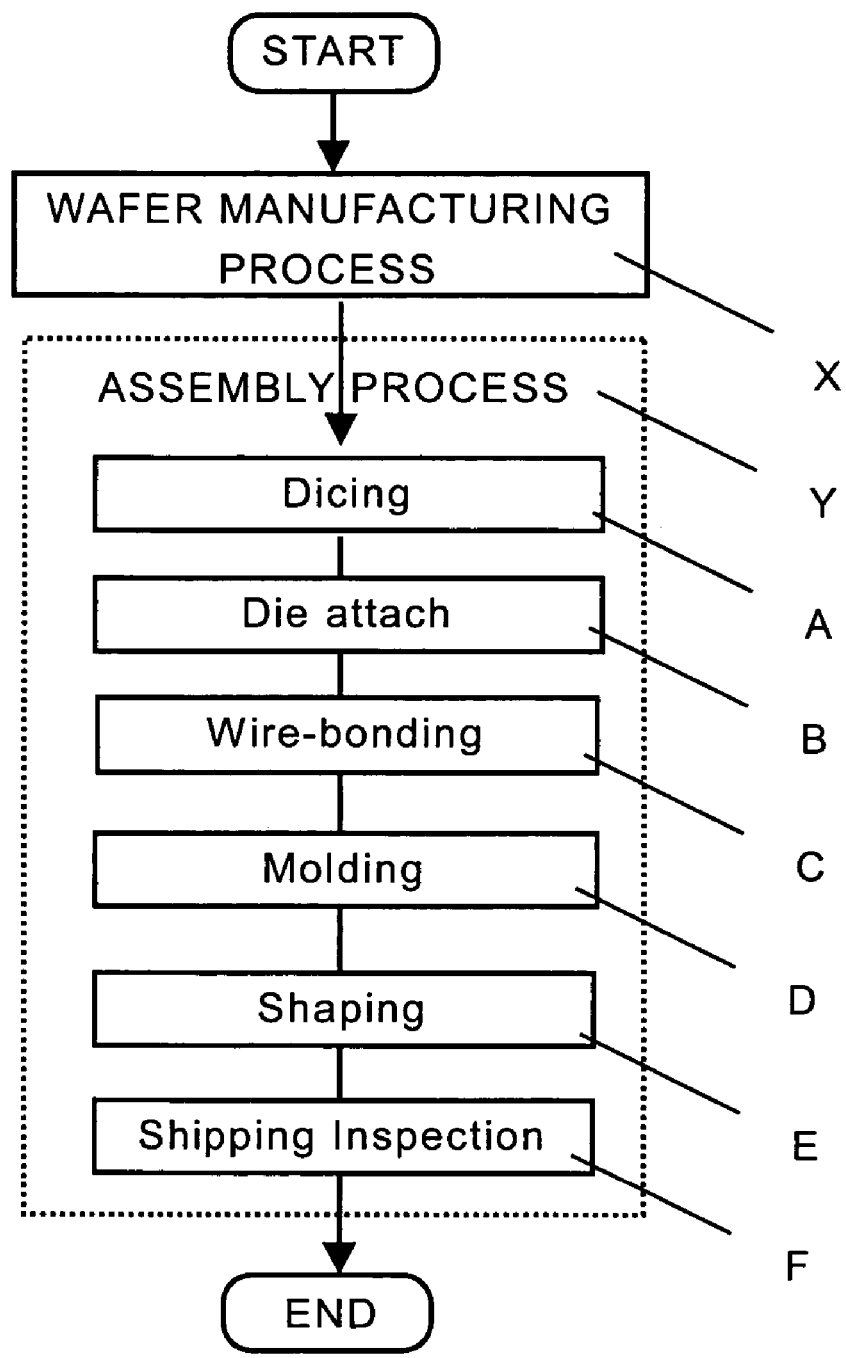
FIG. 7 is a flowchart showing a general out line of manufacturing process of a semiconductor device.
Figure 8:
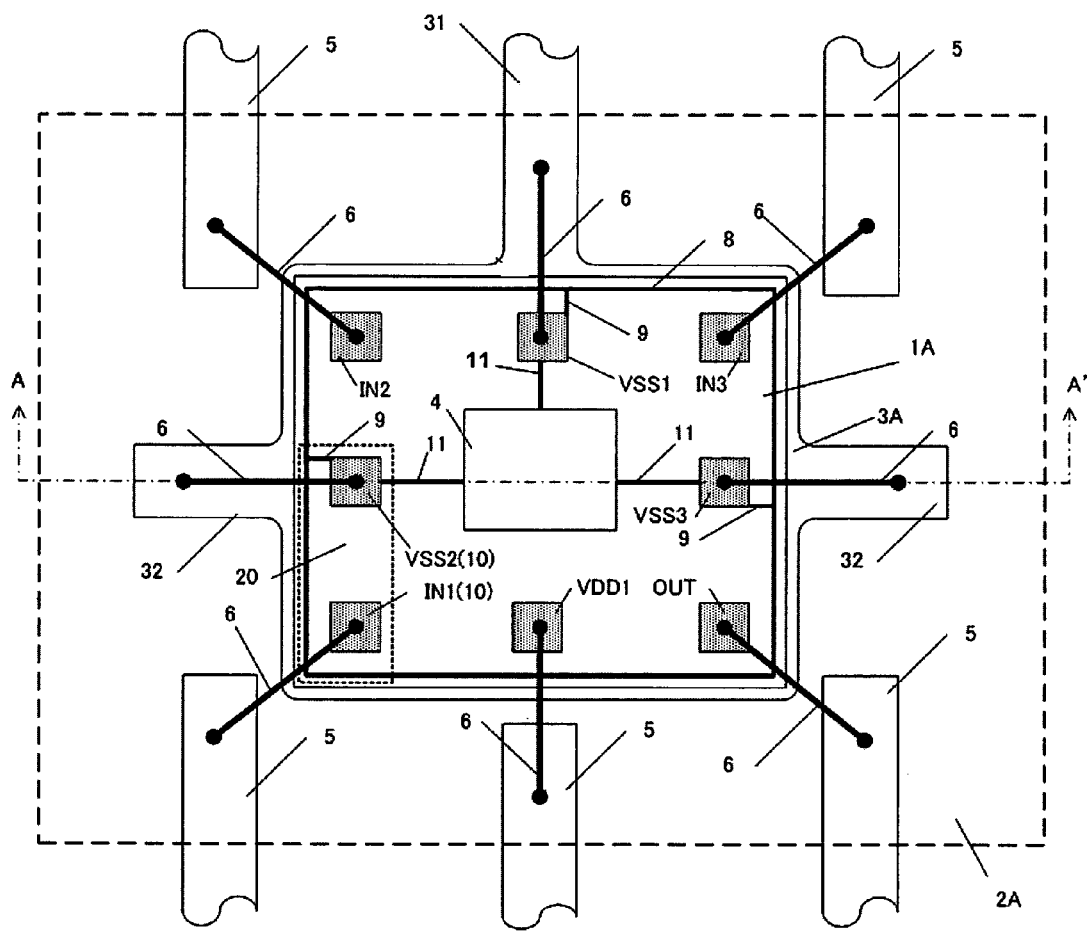
FIG. 8 is a perspective plan view of a conventional semiconductor device.

FIG. 1 is a perspective plan view of a semiconductor device according to an embodiment of the present invention. In the semiconductor device shown in FIG. 1, although a method of manufacturing the same will be described in more detail later, a semiconductor chip 1B whose pattern has been slightly corrected is assembled in a package B without changing the outer dimensions, the pad position, the function, and the performance of a semiconductor chip 1A. Since the semiconductor chip 1B is assembled in the package B that is smaller than the conventional package A, the semiconductor chip 1B is die-bonded to a chip tab 3B of the lead frame 7B which has no tab suspenders 31 shown in FIG. 6B. An input protection circuit 23 (refer to FIG. 3) not shown in FIG. 1 is disposed adjacent to a signal pad IN1, a signal pad IN2, a signal pad IN3, and a signal pad OUT of a semiconductor chip 1. A power supply pad VDD is bonded by wire through one of bonding wires 6 to a wire lead 5 to which a supply voltage VDD is applied, and a power supply pad VSS1 is bonded by wire through one bonding wire 6 to a tab lead 31 to which a supply voltage VSS is applied. Having no tab suspenders 32, a power supply pad VSS2 and a power supply pad VSS3 are not bonded by wire. That is, the power supply pad VSS2 and the power supply pad VSS3 are non-connected power supply pads. On the other hand, a power supply pad VSS1, a power supply pad VSS2, and a power supply pad VSS3 are connected to internal power supply wirings 11 through an internal circuit 4 to be at the same potential. Also, the power supply pad VSS1 is connected to a round power supply wiring 8 through a round power supply connection wiring 9. The power supply pad VSS2 and the power supply pad VSS3 are not connected to the round power supplying wiring 8 owing to round power supply connection wirings 91, which are formed by cutting off the round power supply connection wirings 9, are provided.

In the semiconductor device shown in FIG. 1, the electrostatic noise that enters the semiconductor chip from the signal pad IN2 is led to the power supply voltage VSS from the power supply pad VSS1 due to the action of the input protection circuit 23 (not shown). The electrostatic noise that enters from the signal pad IN1 is led to the round power supply wiring 8 due to the action of the input protection circuit 23 (not shown). The electrostatic noise that enters from the signal pad IN1 is led to the round power supply wiring 8 due to the action of the input protection circuit 23 (not shown). The electrostatic noise is then led from the power supply pad VSS2 to the power supply voltage VSS through the round power supply wiring 8 of a low impedance, without being led to the internal circuit 4 from the power supply pad VSS2 having the cut-off round power supply connection wiring 91. Therefore, different from the semiconductor chip 1A, deterioration of the high noise resistance does not occur in the semiconductor chip 1B since the electrostatic noise is not transmitted to the internal circuit 4 even if the non-connected power supply pad exists.

Subsequently, a method of manufacturing the semiconductor chip 1B will be described. In order to separate the non-connected power supply pad from the round power supply wiring 8, the cut-off round connection wiring 91 is formed on the semiconductor chip 1B by using cutting means for cutting all or a part of the round power supply connection wiring 9 adjacent to the non-connected power supply pad.

According to a first cutting means for manufacturing the semiconductor chip 1B on which the cut-off round connection wiring 91 is formed, all or a part of mask data corresponding to the round power supply connection wiring 9 which is connected to the non-connected power supply pad not bonded by wire is removed from mask data for producing a pad formation mask A for manufacturing the semiconductor chip 1A on which the round connection wiring 9 is formed to there by produce the pad formation mask B with the cut-off round connection wiring 91 (mask data operating means).

According to a second cutting means for manufacturing the semiconductor chip 1B on which the cut-off round connection wiring 91 is formed, the pad formation mask B with the round connection wiring 91 from which all or a part of the round power supply connection wiring 9 connected to the power supply pad to which the pad formation mask A is not bonded by wire is produced by using a high energy beam such as a laser beam (high energy beam cutting means). In the semiconductor chip 1B, the non-connected power supply pad is separated from the round power supply wiring 8 by means of the pad formation mask B.

According to the first cutting means for manufacturing the semiconductor chip 1B on which the cut-off round connection wiring 91 is formed, in a case of the semiconductor chip 1A in which the power supply pad VSS2 and the power supply pad VSS3, which serve as the non-connected power supply pad when assembled in the package B are connected to the round power supply wiring 8 through the round power supply connection wiring 9, the round power supply connection wiring 9 of the non-connected power supply pad is cut off by using a high energy beam such as a laser beam to form the cut-off round connection wiring 91 for separating the non-connected power supply pad from the round power supply wiring 8 to thereby manufacture the semiconductor chop 1B.

As described above, it is apparent that the semiconductor chip 1B can be manufactured during manufacturing process of the semiconductor chip 1A by making a minimum correction thereto using the above-described cutting means without causing an error. Also, in manufacturing the semiconductor chip 1B on which the cut-off round connection wiring 91 is formed, it is possible to use the same manufacturing device, the same manufacturing jig such as a probe card, and the same inspection program, without any alternations, as used in the upstream manufacturing process of the semiconductor chip 1A on which the cut-off round connection wiring 91 is not formed.

In the embodiments, the input protection circuit 23 having the protection diode 24 has been used. However, the input protection circuit having a MOS transistor instead of the protection diode 24 also produces the same effects as those in this embodiment. The bonding pads 10, the round power supply wiring 8, and the round power supply connection wiring 9 that are made of the same metal and formed in the same process produce an enhanced effect of improving the high noise resistance and the power supply impedance.

In the case where a custom semiconductor device that is expensive but easy to satisfy the originality is used for the electronic device, the specification and the packaging form of the semiconductor device are determined according to the specification and the packaging form of the electronic device, the pad layout of the semiconductor chip is designed, and the layout of the internal circuit of the semiconductor chip is designed. On the other hand, in the case where a standard semiconductor device that is inexpensive but difficult to satisfy the originality is used, the specification and the package pattern of the electronic device are designed according to the specification and the package pattern of the standard semiconductor device. Accordingly, the electronic device manufacturer selects the one from the custom semiconductor device and the standard semiconductor device according to the performance and the costs of the electronic device.

According to the present invention, the conformity of the semiconductor chip and the package pattern can be enhanced without losing the reliability by using the similar semiconductor chip that is different only in the round power supply connection wirings to which a slight design change in a short period of time is made. As a result, it is possible to pack the existing semiconductor chip in a wide variety of packages. In addition, the applicable package patterns are increased, thereby making it possible to remarkably reduce the costs of the semiconductor device due to the mass production effect.

What is claimed is:

1. A semiconductor device, comprising:
a round power supply wiring;
a plurality of power supply pads including a first power supply pad and at least one second power supply pad that are connected to internal power supply wirings through an internal circuit so that the first and second power supply pads are set to the same potential, the first power supply pad being bonded by a wire to a lead to which a supply voltage is applied and being connected to the round power supply wiring through a round power supply connection wiring;

a signal pad from which electrostatic noise enters into the semiconductor device; and an input protection circuit connected between the signal pad and the internal circuit and connected to the round power supply wiring through a protection circuit power supply wiring;

wherein the second power supply pad is not bonded by a wire to a lead to which a supply voltage is applied and is not connected to the round power supply wiring so that when electrostatic noise enters the signal pad, the electrostatic noise is discharged to the exterior of the semiconductor device without the electrostatic noise being led to the internal circuit.

2. A semiconductor device according to claim 1; wherein the at least one second power supply pad comprises two power supply pads that are not bonded by respective wires to respective leads to which a supply voltage is applied and are not connected to the round power supply wiring.

3. A semiconductor device according to claim 1; wherein the input protection circuit has a protection diode.

4. A semiconductor device according to claim 1; wherein the input protection circuit has a MOS transistor.

5. A semiconductor device according to claim 1; wherein the round power supply wiring and the round power supply connection wiring are made of the same metal.

6. A semiconductor device comprising:
a round power supply wiring;
a first power supply pad connected to the round power supply wiring;
a signal pad from which electrostatic noise enters into the semiconductor device;
an input protection circuit connected between the signal pad and an internal circuit and connected to the round power supply wiring; and
at least one second power supply pad that is connected with the first power supply pad to internal power supply wirings through the internal circuit so that the first and second power supply pads are set to the same potential, the second power supply pad being disconnected from the round power supply wiring so that electrostatic noise which enters from the signal pad is prevented from entering the second power supply pad and is discharged externally of the semiconductor device without being led to the internal circuit.

7. A semiconductor device according to claim 6; wherein the at least one second power supply pad comprises two power supply pads.

8. A semiconductor device according to claim 6; wherein the input protection circuit has a protection diode.

9. A semiconductor device according to claim 6; wherein the input protection circuit has a MOS transistor.

* * * * *